(12) United States Patent
Cheng et al.

(10) Patent No.: US 7,186,605 B2
(45) Date of Patent: Mar. 6, 2007

(54) METHOD OF FABRICATING GATES

(75) Inventors: Po-Lun Cheng, Fongshan (TW); Li-Wei Cheng, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 96 days.

(21) Appl. No.: 11/016,050

(22) Filed: Dec. 17, 2004

(65) Prior Publication Data

US 2006/0134842 A1    Jun. 22, 2006

(51) Int. Cl.
*H01L 21/336* (2006.01)
*H01L 21/8234* (2006.01)
*H01L 21/8238* (2006.01)
*H01L 21/3205* (2006.01)
*H01L 21/4763* (2006.01)

(52) U.S. Cl. .................. 438/197; 438/216; 438/585; 438/275

(58) Field of Classification Search ............. 438/197, 438/216, 275, 261, 591, 585, 199, 287
See application file for complete search history.

(56) References Cited

U.S. PATENT DOCUMENTS 6,410,376 B1 *   6/2002   Ng et al. .................... 438/199
6,677,652 B2 *   1/2004   Lin et al. ................... 257/407

* cited by examiner

*Primary Examiner*—Chuong Anh Luu
(74) *Attorney, Agent, or Firm*—J.C. Patents

(57) ABSTRACT

A method of fabricating gates is provided. A first sacrificial layer having a first and a second gate openings therein is formed on a substrate. Next, a gate dielectric layer is formed on the substrate exposed by the first sacrificial layer. Thereafter, a second sacrificial layer is filled in the first and second gate openings. The second sacrificial layer in the first gate opening is removed, and then a first conductive layer is filled in the first gate opening as a gate of a MOS transistor of a first conductivity type. Then, the second sacrificial layer in the second gate opening is removed. A second conductive layer is filled in the second gate opening as a gate of a MOS transistor of a second conductivity type, and the first sacrificial layer is removed.

17 Claims, 2 Drawing Sheets

METHOD OF FABRICATING GATES

BACKGROUND OF THE INVENTION

1. Field of the Invention

The present invention generally relates to a semiconductor process. More particularly, the present invention relates to a method of fabricating gates.

2. Description of Related Art

In a conventional MOS process, a gate dielectric layer and a poly-Si layer are sequentially formed on a substrate, and then the poly-Si layer is patterned into a gate using lithography and etching techniques. Thereafter, ion implantation is conducted to form a source/drain region in the substrate beside the gate.

The conventional material of MOS gates is doped poly-Si. However, poly-Si is not an ideal gate material in advanced processes for having higher resistance. Therefore, metal is currently used to form the gates in many advanced MOS processes to solve the above problem.

Unfortunately, a metal gate has a disadvantage that defects are easily produced at the interface between the metal gate and the gate dielectric layer during the etching process of the metal gate. In addition, when devices become smaller, exactly defining a metal gate through metal etching is more difficult.

On the other hand, the integration of metal-gate CMOS process including PMOS and NMOS processes suffers from many problems, such as etching, thermal or contamination issue. Especially, it is hard for NMOS and PMOS devices to maintain their optimal wok functions. Therefore, the performance of the CMOS device cannot be well adjusted.

SUMMARY OF THE INVENTION

Accordingly, the present invention provides a method of fabricating gates, which is capable of solving the aforementioned problems.

The method of fabricating gates of the present invention is described as follows. A first sacrificial layer having a first and a second gate openings therein is formed on a substrate. Next, a gate dielectric layer is formed on the substrate exposed by the first sacrificial layer. Thereafter, a second sacrificial layer is filled in the first and second gate openings. The second sacrificial layer in the first gate opening is removed, and then a first conductive layer is filled in the first gate opening as the gate of a first MOS transistor of a first conductivity type. Then, the second sacrificial layer in the second gate opening is removed. A second conductive layer is filled in the second gate opening as the gate of a second MOS transistor of a second conductivity type, and the first sacrificial layer is removed.

Since the above process of forming gates utilizes a damascene method, rather than a conventional direct-etching method, the quality of the interface between a metal gate and the gate dielectric layer can be improved, and the metal gate can be defined more exactly. Moreover, since the first conductive layer and the second conductive layer can be different, the work functions of PMOS and NMOS can be optimized respectively.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
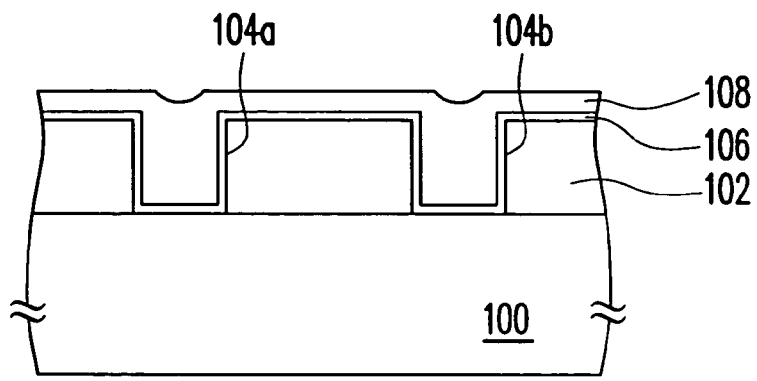
FIGS. 1A–1F illustrate a process flow of fabricating gates according to a preferred embodiment of this invention.

Reference will now be made in detail to the present preferred embodiment of the invention, an example of which is illustrated in the accompanying drawings. Wherever possible, the same reference numbers are used in the drawings and the description to refer to the same or like parts.

In the following description, the first conductivity type is N-type, and the second conductivity type is P-type. In other preferred embodiments of this invention, the definitions of the first and second conductivity types can be exchanged with each other.

Referring to FIG. 1A, a sacrificial layer 102 is formed on a substrate 100, with gate openings 104a and 104b therein exposing portions of the substrate 100. It is noted that the thickness of the sacrificial layer 102 is the sum of those of the gate and the gate dielectric layer formed later, ranging from 10 Å to 600 Å, for example.

Then, a substantially conformal gate dielectric layer 106 is formed over the substrate 100, and the material of the layer 106 is preferably $SiO_2$, SiON, $HfO_2$, $Al_2O_3$, HfSiO, HfSiON or other high-K dielectric material. The method of forming the gate dielectric layer 106 is, for example, atomic layer deposition or metal-organic chemical vapor deposition. In addition, the thickness of the gate dielectric layer 106 is 3–50 Å.

Thereafter, a blanket sacrificial layer 108 is formed over the substrate 100, covering the gate dielectric layer 106 and filling the gate openings 104a and 104b at least. The method of forming the blanket sacrificial layer 108 is, for example, chemical vapor deposition.

Figure 1B:
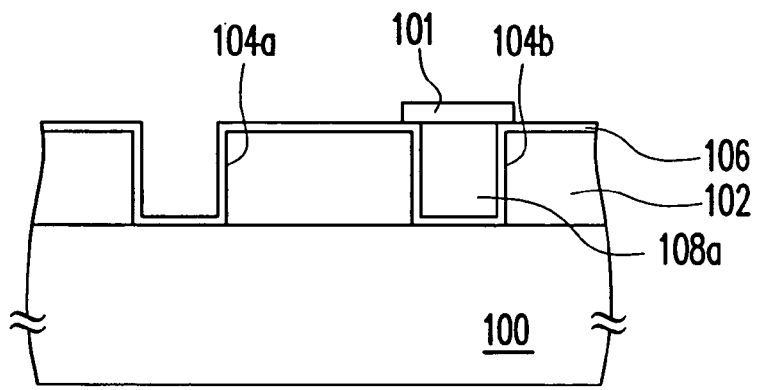

Referring to FIG. 1B, the blanket sacrificial layer 108 outside the gate openings 104a and 104b is removed to form a sacrificial layer 108a. The removing method is, for example, chemical mechanical polishing or etching-back.

Then, a mask layer 101 is formed to cover the sacrificial layer 108a in the gate opening 104b and then removing the sacrificial layer 108a not covered by the mask layer 101. In the example, the mask layer 101 preferably has an etching selectivity lower than that that of the sacrificial layer 108a, and such the mask layer 101 is, for example, a photoresist layer.

Figure 1C:
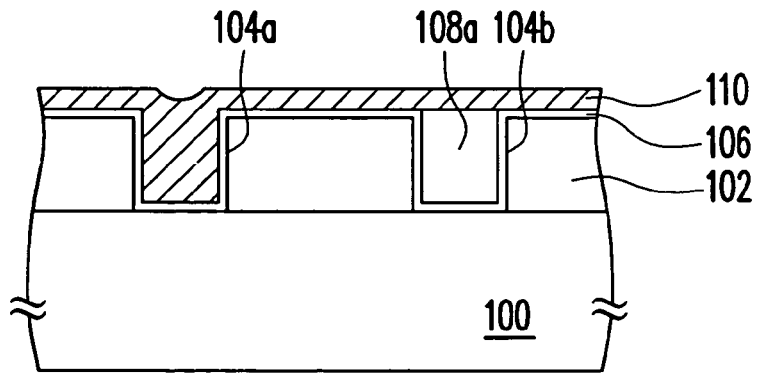

Referring to FIG. 1C, after the mask layer 101 is removed, a conductive layer 110 as the gate material of NMOS is formed on the substrate 100, filling the gate opening 104a at least. The material of the conductive layer 110 is, for example, Ta, TaN, TaSiN, TiN, Ru—Ta alloy or other gate material suitable for NMOS. The method of forming the conductive layer 110 is, for example, atomic layer deposition or metal-organic chemical vapor deposition.

Figure 1D:
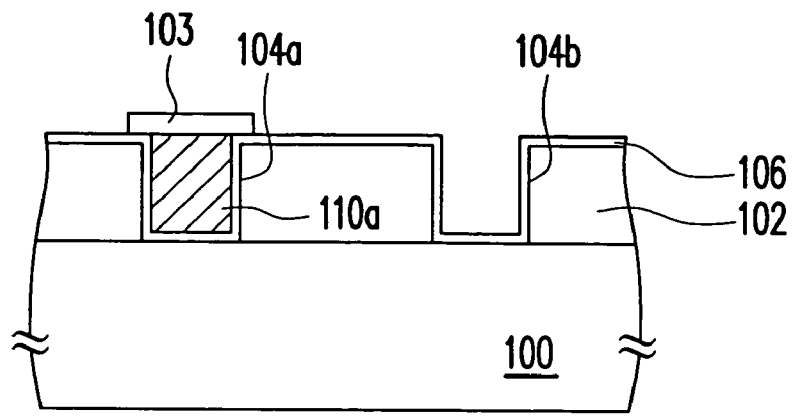

Referring to FIG. 1D, the conductive layer 110 outside the gate openings 104a is removed to form an NMOS gate 110a. The removing method is, for example, chemical mechanical polishing or etching-back.

Briefly speaking, the NMOS gate 110a is formed with using a damascene method, rather than a conventional direct-etching method. Therefore, the quality of the interface between the NMOS gate 110a and the gate dielectric layer 106 can be improved with the present invention, and the NMOS gate 110a can be defined more exactly.

Then, another mask layer 103 is formed to cover the NMOS gate 110a in the gate opening 104a and then removing the sacrificial layer 108a not covered by the mask layer 103. In the example, the mask layer 103 preferably has an etching selectivity lower than that of the sacrificial layer 108a, and such the mask layer 103 is, for example, a photoresist layer.

Figure 1E:
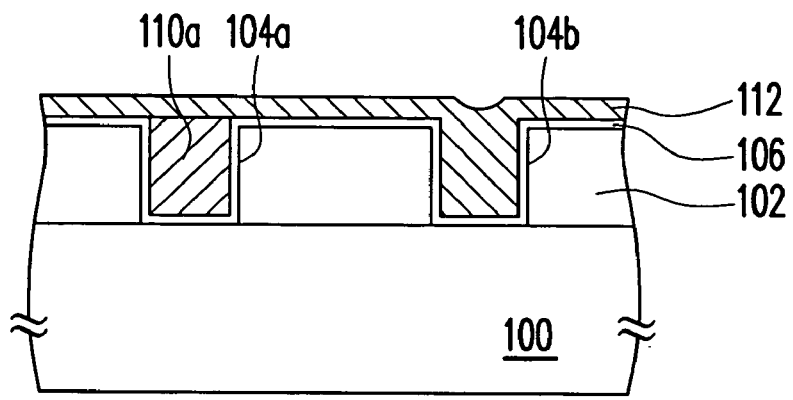

Referring to FIG. 1E, after the mask layer 103 is removed, a conductive layer 112 as the gate material of PMOS is formed on the substrate 100, filling the gate opening 104b at least. The material of the conductive layer 112 is, for example, Ru, $RuO_2$, W, TiN, Ru—Ta alloy or other gate material suitable for PMOS. The method of forming the conductive layer 112 is, for example, atomic layer deposition or metal-organic chemical vapor deposition.

Figure 1F:
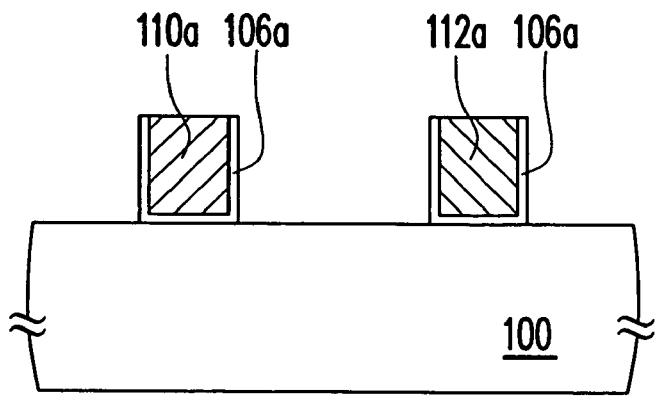

Referring to FIG. 1F, the conductive layer 112 outside the gate openings 104b is removed to form a PMOS gate 112a. The removing method is, for example, chemical mechanical polishing or etching-back.

Briefly speaking, the PMOS gate 112a is also formed using a damascene method, rather than a conventional direct-etching method. Therefore, the quality of the interface between the PMOS gate 112a and the gate dielectric layer 106 can be improved with the invention, and the PMOS gate 112a can be defined more exactly.

Then, the sacrificial layer 102 is removed after the gate dielectric layer 106 thereon is removed, leaving a portion 106a of the gate dielectric layer 106. The removing method is, for example, a dry or wet etching method. Moreover, the thickness of the gates 10a and 112a ranges, for example, from 10 Å to 500 Å.

After the gates 110a and 112a are formed, the sources/drains of NMOS and PMOS can be formed as usual to complete the CMOS process.

Since the present invention utilizes the damascene technology to form the gates of different work functions, the quality of the interface between a metal gate and the gate dielectric layer can be improved, and the metal gate can be defined more exactly. In addition, since the materials of the NMOS gate and the PMOS gate can be different, the work functions of the NMOS gate and the PMOS gate can be optimized respectively, so that the performance of the CMOS device can be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating gates, comprising:
   forming, on a substrate, a first sacrificial layer having a first gate opening and a second gate opening therein;
   forming a gate dielectric layer on the substrate exposed by the first sacrificial layer;
   filling a second sacrificial layer in the first gate opening and the second gate opening;
   removing the second sacrificial layer in the first gate opening;
   filling a first conductive layer in the first gate opening as a first gate of a first MOS transistor of a first conductivity type;
   removing the second sacrificial layer in the second gate opening;
   filling a second conductive layer in the second gate opening as a second gate of a second MOS transistor of a second conductivity type; and
   removing the first sacrificial layer to expose the gate dielectric layer on the sidewalls of the first and second gates.

2. The method according to claim 1, wherein one of the first and second MOS transistors is a PMOS transistor, and the other is an NMOS transistor.

3. The method according to claim 2, wherein the gate of the PMOS transistor comprises Ru, $RuO_2$, W, TiN or Ru—Ta alloy.

4. The method according to claim 2, wherein the gate of the NMOS transistor comprises Ta, TaN, TaSiN, TiN or Ru—Ta alloy.

5. The method according to claim 1, wherein forming a gate in a corresponding gate opening comprises:
   forming a conductive material on the substrate, filling the gate opening at least; and
   removing the conductive material outside the gate opening.

6. The method according to claim 5, wherein forming the conductive material comprises an atomic layer deposition process or a metal-organic chemical vapor deposition process.

7. The method according to claim 5, wherein removing the conductive material outside the gate opening comprises a chemical mechanical polishing process or an etching-back process.

8. The method according to claim 1, wherein the gate dielectric layer comprises $SiO_2$, SiON, $HfO_2$, $Al_2O_3$, HfSiO, or HfSiON.

9. The method according to claim 1, wherein forming the gate dielectric layer comprises an atomic layer deposition process or a metal-organic chemical vapor deposition process.

10. The method according to claim 1, wherein a thickness of the first sacrificial layer is equal to the sum of thicknesses of the first or second gate and the gate dielectric layer.

11. The method according to claim 10, wherein the thickness of the first sacrificial layer ranges from 10 Å to 600 Å.

12. The method according to claim 10, wherein the thickness of the first or second gate ranges from 10 Å to 500 Å.

13. The method according to claim 1, wherein removing the first sacrificial layer comprises a dry etching process or a wet etching process.

14. The method according to claim 1, wherein filling the second sacrificial layer in the first and second gate openings comprises:
   forming a sacrificial material over the substrate, filling the first and second gate openings at least; and
   removing the sacrificial material outside the first and second gate openings.

15. The method according to claim 14, wherein removing the sacrificial material outside the first and second gate openings comprises a chemical mechanical polishing process or an etching-back process.

16. The method according to claim 1, wherein removing the second sacrificial layer in the first gate opening comprises:
   forming a mask layer to cover the second sacrificial layer in the second gate opening; and
   removing the second sacrificial layer not covered by the mask layer, wherein an etching selectivity of the mask layer is lower than an etching selectivity of the second sacrificial layer.

17. The method according to claim 1, wherein removing the second sacrificial layer in the second gate opening comprises:
   forming a mask layer to cover the first gate in the first gate opening; and
   removing the second sacrificial layer not covered by the mask layer, wherein an etching selectivity of the mask layer is lower than an etching selectivity of the second sacrificial layer.

* * * * *